United States Patent
Brown

(10) Patent No.: US 7,314,350 B2
(45) Date of Patent: Jan. 1, 2008

(54) ENERGY STORE CIRCUIT FOR CONTROLLING ROTOR ROTATION

(75) Inventor: Fred A. Brown, Coronado, CA (US)

(73) Assignee: Comair Rotron, Inc., San Diego, CA (US)

( * ) Notice: Subject to any disclaimer, the term of this patent is extended or adjusted under 35 U.S.C. 154(b) by 562 days.

(21) Appl. No.: 10/616,499

(22) Filed: Jul. 9, 2003

(65) Prior Publication Data

US 2004/0036431 A1 Feb. 26, 2004

Related U.S. Application Data

(60) Provisional application No. 60/417,827, filed on Oct. 11, 2002, provisional application No. 60/397,694, filed on Jul. 22, 2002.

(51) Int. Cl.
  *F04B 49/06* (2006.01)
(52) U.S. Cl. .................... 417/44.1; 417/44.11; 417/411
(58) Field of Classification Search ............ 417/44.1, 417/44.11, 411; 310/72, 68 R; 318/794, 318/795, 796
See application file for complete search history.

(56) References Cited

U.S. PATENT DOCUMENTS

| | | | |
|---|---|---|---|
| 3,841,746 A | 10/1974 | Chase et al. ................. 353/15 |
| 4,494,055 A | 1/1985 | Bitting et al. ............... 318/254 |
| 4,499,408 A | 2/1985 | Bitting et al. ............... 318/254 |
| 4,500,821 A | 2/1985 | Bitting et al. ............... 318/254 |
| 4,535,275 A | 8/1985 | Müller ........................ 318/254 |
| 4,618,803 A * | 10/1986 | Hardy ..................... 315/241 R |
| 4,751,398 A | 6/1988 | Ertz, III ....................... 307/66 |
| 5,619,076 A | 4/1997 | Layden et al. ................ 307/48 |
| 6,388,392 B1 * | 5/2002 | Flory, IV .................... 315/291 |
| 6,709,111 B2 * | 3/2004 | Hirao et al. ................... 353/52 |
| 7,137,015 B2 | 11/2006 | Su .............................. 713/300 |

FOREIGN PATENT DOCUMENTS

| | | |
|---|---|---|
| JP | 01123419 | 5/1989 |
| JP | 403052575 A | 3/1991 |
| JP | 406098479 A | 4/1994 |
| JP | 10197952 | 7/1998 |
| JP | H11-231419 | 8/1999 |
| JP | 2000021457 A | 1/2000 |

* cited by examiner

*Primary Examiner*—Anthony Stashick
*Assistant Examiner*—Vikansha Dwivedi
(74) *Attorney, Agent, or Firm*—Bromberg & Sunstein LLP

(57) ABSTRACT

A fan controller for controlling the rotation of a rotor (with a fan blade) has a current limiting element to control current flow to a capacitive storage apparatus. More specifically, the fan controller has an input for receiving an input voltage, the noted capacitive storage in electrical communication with both rotor circuitry (that controls rotor rotation) and the input, and the noted current limiting element coupled between the input and the capacitive storage. The rotor circuitry is energizable by the input voltage, while, in a similar manner, the capacitive storage is capable of charging by receiving current from the input. The current limiting element at least in part controls current flow from the input to the capacitive storage.

27 Claims, 4 Drawing Sheets ed the current limiting element is configured to control current flow from the input to the capacitive storage at least in part as a function of the amount of current required to be drawn by the rotor circuitry. Moreover, among other things, the current limiting element may include a PTC, or an adjustable linear voltage/current regulator. Additionally, the capacitive storage may have a plurality of series capacitors. In some embodiments, the current limiting element is configured to ensure that the rotor circuitry has sufficient current to rotate the rotor when the storage element is storing power. In some such embodiments, the rotation should be sufficient to permit the fan to provide appropriate air flow for a given application.

ENERGY STORE CIRCUIT FOR CONTROLLING ROTOR ROTATION

PRIORITY

This patent application claims priority from provisional U.S. patent application No. 60/417,827, filed Oct. 11, 2002, entitled, "FAN ENERGY STORE," and naming Fred A. Brown as inventor, the disclosure of which is incorporated herein, in its entirety, by reference.

This patent application also claims priority from provisional U.S. patent application No. 60/397,694, filed Jul. 22, 2002, entitled, "FAN RESERVOIR CONTROLLER," and naming Fred A. Brown as inventor, the disclosure of which is incorporated herein, in its entirety, by reference.

FIELD OF THE INVENTION

The invention generally relates to electric motors and, more particularly, the invention relates to devices and methods of extending rotation time of a rotor in the absence of an input power.

BACKGROUND OF THE INVENTION

A number of cooling applications require that a fan continue to run even after the heat generating element being cooled is turned off. For example, high intensity projector light systems typically are cooled by fans that run for a pre-set time period after its light source (e.g., a high wattage light bulb) is turned off. Without this extra cooling, the excess heat generated by the light source could immediately damage itself and/or other components of the overall system. Moreover, this excess heat also can shorten the overall lifetime of the system.

Accordingly, to avoid these problems, fans used for these applications commonly have a delay circuit that continues to power the fan for a (limited) pre-set time period after the light source is turned off. In other words, even though the light source no longer receives power, the fan continues to receive power (i.e., from the power source that powers the overall system) for the noted pre-set time period. After this time period has elapsed, the fan also turns off.

Problems arise, however, during a power loss. Specifically, if there is a power loss, then both the fan and light source turn off at the same time. In other words, even though the fan includes the noted delay circuit, it still is not energized and thus, cannot rotate the rotor to generate cooling air flow. Consequently, the excess heat generated by the light source can damage the overall system.

SUMMARY OF THE INVENTION

In accordance with one aspect of the invention, a fan controller for controlling the rotation of a rotor (with a fan blade) has a current limiting element to control current flow to a capacitive storage apparatus. More specifically, the fan controller has an input for receiving an input voltage, the noted capacitive storage in electrical communication with both rotor circuitry (that controls rotor rotation) and the input, and the noted current limiting element coupled between the input and the capacitive storage. The rotor circuitry is energizable by the input voltage, while, in a similar manner, the capacitive storage is capable of charging by receiving current from the input. The current limiting element at least in part controls current flow from the input to the capacitive storage.

In illustrative embodiments, the current limiting element is configured to control current flow from the input to the capacitive storage at least in part as a function of the amount of current required to be drawn by the rotor circuitry. Moreover, among other things, the current limiting element may include a PTC, or an adjustable linear voltage/current regulator. Additionally, the capacitive storage may have a plurality of series capacitors. In some embodiments, the current limiting element is configured to ensure that the rotor circuitry has sufficient current to rotate the rotor when the storage element is storing power. In some such embodiments, the rotation should be sufficient to permit the fan to provide appropriate air flow for a given application.

In accordance with another aspect of the invention, a circuit for controlling the rotation of a rotor having associated rotor control circuitry (for rotating the rotor) has an input, a storage element capable of storing charge by drawing current from the input, and a current limiting element coupled between the input and storage element. The rotor control circuitry is capable of rotating the rotor in response to receipt of current drawn from the input. Moreover, the current limiting element is configured to control the current drawn by the storage element at least in part as a function of the current required to be drawn by the rotor control circuitry.

In illustrative embodiments, the current limiting element is configured to ensure that the rotor circuitry receives enough current to rotate the rotor at the intended rate (based upon the given application) when the storage element is storing power. Accordingly, in such embodiments, the current limiting element is configured based upon the application in which the rotor is to be used. In other embodiments, the current limiting element is configured to ensure that the motor begins operating substantially immediately after start-up (e.g., within 1-3 seconds after start-up).

BRIEF DESCRIPTION OF THE DRAWINGS

The foregoing and advantages of the invention will be appreciated more fully from the following further description thereof with reference to the accompanying drawings, wherein.

DESCRIPTION OF ILLUSTRATIVE EMBODIMENTS

In accordance with illustrative embodiments of the invention, a cooling system includes a charge storage element that charges while a heat generating element (e.g., a light bulb) is energized, and discharges to power a cooling fan that cools the heat generating element when power is turned off (e.g., when the heat generating element is not energized). For example, among other ways, power may be turned off unexpectedly during a power outage, or merely when the system no longer is connected to a power source.

In addition, some embodiments of the invention include a limiting element for limiting power flow to the charge storage element, particularly during start-up. The limiting element is specifically configured to the requirements of the overall system to optimize start-up power flow to such elements. More specifically, the limiting element ensures that the charge storage element does not draw so much power that other system components cannot operate relatively quickly after power initially is applied. Details of various embodiments are discussed below.

Figure 1:
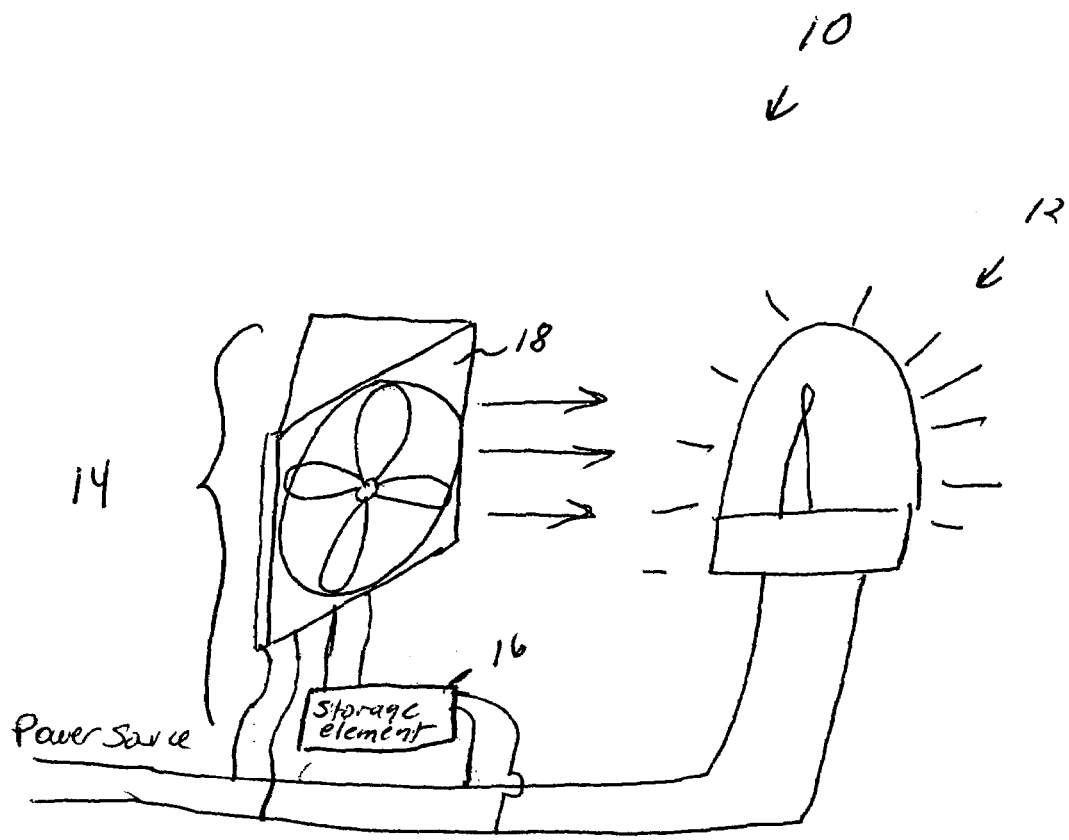
FIG. 1 schematically shows a system with a heat generating element and a fan configured in accordance with illustrative embodiments of the invention.

FIG. 1 schematically shows a system 10 with a heat generating element 12 and a cooling element 14 configured to cool the heat generating element 12 in accordance with illustrative embodiments of the invention. In illustrative embodiments and discussed herein by example, the system 10 is a high intensity projector light system ("light system") having a heat generating bulb that can damage other components and/or itself if not sufficiently cooled. As noted above, the cooling element 14 is configured to continue to cool the bulb for a specified time even when power no longer is delivered to the system 10. In other words, the cooling element 14 continues to cool the bulb for a specified time even after a power outage or some other type of power loss occurs. To these ends, the cooling element 14 includes a charge storage element 16 that stores power for such purposes.

It should be noted that although a light system is discussed, illustrative embodiments may be applied to a variety of heat generating systems that require cooling. For example, illustrative embodiments may be applied to electronic components, such as microprocessors, digital, and analog circuit elements, or other types of lighting systems, such as medical lighting systems.

Figure 2:
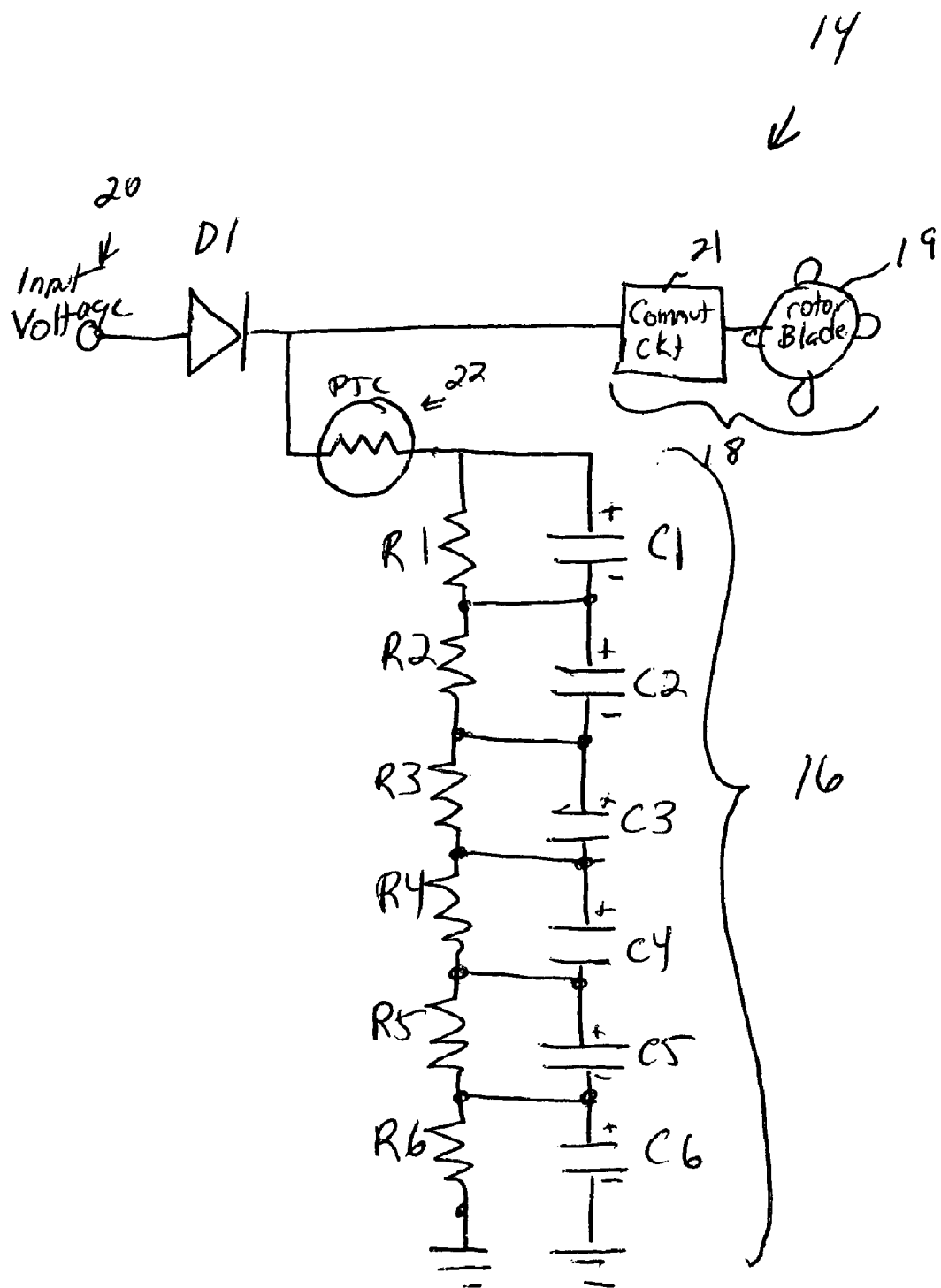
FIG. 2 schematically shows a circuit that may be used to implement illustrative embodiments of the invention.

FIG. 2 schematically shows details of a cooling element 14 configured in accordance with illustrative embodiments of the invention. The cooling element 14 includes a conventional electric fan 18 (e.g., one of the DC fans distributed by Comair Rotron, Inc. of San Diego, Calif.) for directing air flow toward the bulb (shown in FIG. 1), an input 20 for receiving a DC voltage to power the cooling element 14, and the above noted charge storage element 16, which powers the fan 18 for a limited time when no DC voltage is received at the input 20. In some embodiments, the input voltage is an AC voltage. In such case, if the fan is a DC fan, then conventional conversion circuitry (e.g., rectifiers) may be employed to convert the input voltage from AC to DC.

As known by those skilled in the art, the fan 18 includes a rotor 19 with an attached propeller for generating air flow, and commutation circuitry 21 for controlling the rotation of the rotor 19. The commutation circuit may be similar to those commonly used in conventional DC motors. It should be noted that the term, "commutation circuitry" is used to mean both electronically or mechanically commutation circuitry. Accordingly, the commutation circuitry may be the circuitry used in brushless or brush-type motors. Moreover, in alternative embodiments, the fan 18 may be an AC fan. In such case, conversion circuitry (not shown) is included between the charge storage element 16 and fan 18 to convert DC voltage/current to AC voltage/current.

In accordance with illustrative embodiments, the cooling element 14 also includes a limiting element (hereinafter "current limiting circuit 22") regulating current flow to and from the charge storage element 16. Among other things, the current limiting circuit 22 may be a positive temperature coefficient thermistor (referred to herein and known in the art as a "PTC"), which has a resistance that is related to its temperature and the current flowing through it. Details of various embodiments of the current limiting circuit 22 are discussed below. A diode D1 also is connected between the input 20 and the commutation circuitry 19 to ensure that current does not flow back to the input 20 when the charge storage element 16 discharges.

The charge storage element 16 includes a plurality of capacitors C1-C6 connected in series. Illustratively, each capacitor has substantially identical capacitance and voltage. For example, each capacitor may have a rated capacitance of 6.8 farads with a rated voltage of 2.5 volts. Using such elements, the total maximum voltage of the series capacitors C1-C6 shown thus equals fifteen volts. Accordingly, this configuration should suffice when the input voltage does not exceed fifteen volts.

Each capacitor also has a corresponding parallel resistor (the plurality of resistors being identified as resistors R1-R6) to ensure that the voltage across all the capacitors C1-C6 is substantially the same. Specifically, capacitor C1 is in parallel with resistor R1, capacitor C2 is in parallel with resistor R2, etc. . . . In a manner similar to the capacitors C1-C6, the resistors R1-R6 also illustratively have the same resistance to ensure that each capacitor stores the same charge (i.e., voltage). The resistance of each resistor may be set to be relatively high to minimize current draw by the resistors R1-R6. For example, the resistors R1-R6 each may be 50 kiloohms, which should draw a negligible current when used with the above noted voltages and elements.

As discussed above, the current limiting circuit 22 illustratively may be a PTC (also referred to as "PTC 22"). For example, the PTC 22 may be a threshold type PTC, such as those distributed by Raychem Corporation, which currently is a subsidiary of Tyco International Ltd. As known by those skilled in the art, a threshold type PTC maintains a relatively low resistance until it reaches a specified temperature. When the PTC 22 reaches this temperature, which is referred to in the art as the "trip point," its resistance immediately jumps to a pre-specified higher level. This increased resistance consequently significantly limits current flow through the PTC 22, thus reducing current flow to the capacitors C1-C6. In exemplary embodiments, the trip point may occur when the PTC 22 senses 1 amp of current, and the significantly decreased current flow may be 200 milliamps. A description of the interaction of the PTC 22 and the capacitors C1-C6 during start-up follows immediately below.

Figure 3:
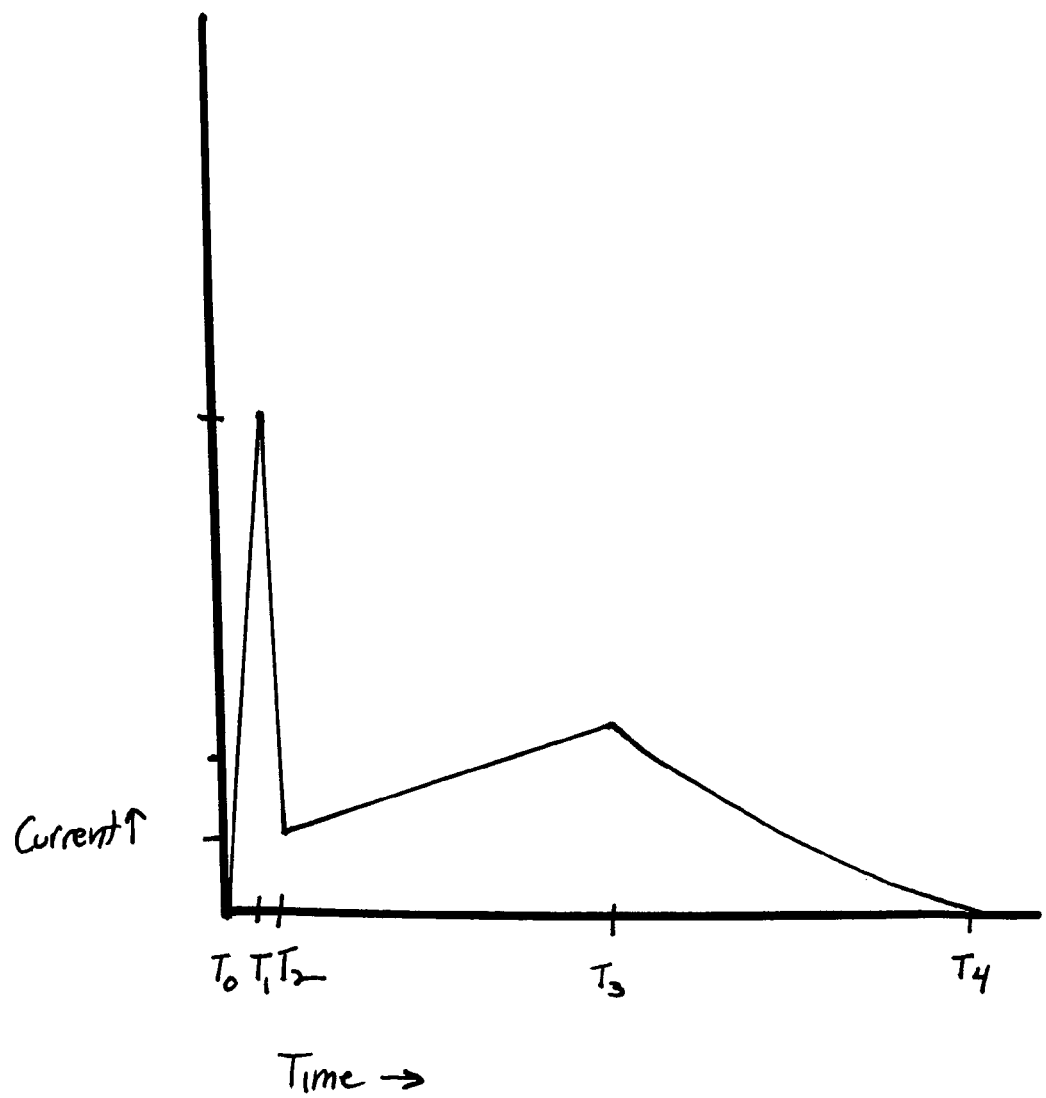
FIG. 3 graphically shows approximate current flow through the current limiting element shown in FIG. 2 as a function of time.

To facilitate that description, FIG. 3 graphically shows an approximation of current flow through the PTC 22 from start-up to the time the capacitors C1-C6 are fully charged. It should be noted that FIG. 3 is not drawn to scale. Accordingly, FIG. 3 is provided for convenience purposes. Moreover, another PTC may be used that has different current flow characteristics. Such a PTC nevertheless has characteristics that are consistent with the goals of various embodiments of the invention.

Immediately after start-up (i.e., the time interval from time T0 to time T1), the capacitors C1-C6 initially draw a significant amount of current from the DC input 20. This high current draw substantially immediately (e.g., in less than one second) increases the temperature of the PTC 22 to its trip point, which causes it to significantly increase its resistance. As noted above, this increased resistance significantly limits the current that the capacitors C1-C6 can draw (see time T2). Accordingly, after time T1, the fan 18 draws the substantial majority of the current from the DC input 20, thus permitting it to begin cooling the bulb substantially immediately at start-up. If the cooling element 14 did not have a PTC or some other current limiting circuit, then the capacitors C1-C6 undesirably would draw a significant amount of the input current during start up, consequently drawing current away from the fan 18. This could damage the bulb or other system components because the fan 18 would not start cooling the bulb until a later time.

The PTC 22 gradually cools after the current through it abruptly decreases. Consequently, its resistance lowers, thus permitting an increasing amount of current to flow to the capacitors C1-C6 (see time T2 to time T3). The system components are selected so that this increasing current is not high enough to cause the PTC 22 to again heat to its trip point. In addition, this increasing current should not be large enough to significantly affect fan operation. In illustrative embodiments, the current draw to the capacitors C1-C6 increases from the abruptly decreased current (i.e., time T2) to a maximum current (i.e., time T3), and then begins to decrease as the capacitors C1-C6 require a lower current draw. The capacitor current draw continues to decrease to zero, at which point the capacitors C1-C6 are substantially fully charged (i.e., time T4).

Accordingly, the PTC 22 is configured to permit the capacitors C1-C6 to charge in a manner that does not significantly interfere with the operation of the fan 18. In other words, the fan 18 should be able to accomplish its intended function; i.e., rotating at a rate that is substantially the same as, or slightly slower than (but sufficient for the intended application), the rate it would rotate if the capacitors C1-C6 were not coupled. Proper selection of the PTC 22 (e.g., trip current and reduced current) in conjunction with the component values of the to other circuit elements should enable this. For example, one skilled in the art can determine an amount of current required by the commutation circuitry 21 to sufficiently rotate the fan 18 during start-up. Based upon this value, the PTC 22 can be selected. Accordingly, the PTC 22 is selected (i.e., it is configured) as a function of the requirements of the commutation circuitry 21.

If power to the system 10 is turned off, then the capacitors C1-C6 immediately begin to discharge. Accordingly, during discharge, current flows from the capacitors C1-C6 to the commutation circuit, thus causing the rotor to continue to turn until the capacitors C1-C6 are substantially fully discharged. As noted above, the diode D1 ensures that the capacitor discharge current does not flow to the input 20. The capacitor discharge current illustratively is not large enough to cause the PTC 22 to reach its trip point.

In alternative embodiments, the resistors R1-R6 are eliminated. In yet other embodiments, additional or fewer capacitors may be used. Among other factors, the total number of capacitors used is dependent upon the input voltage, capacitance and voltage of each capacitor, and the time period required (e.g., one, two, three, or more minutes) for energizing the commutation circuitry after power is turned off.

Figure 4:
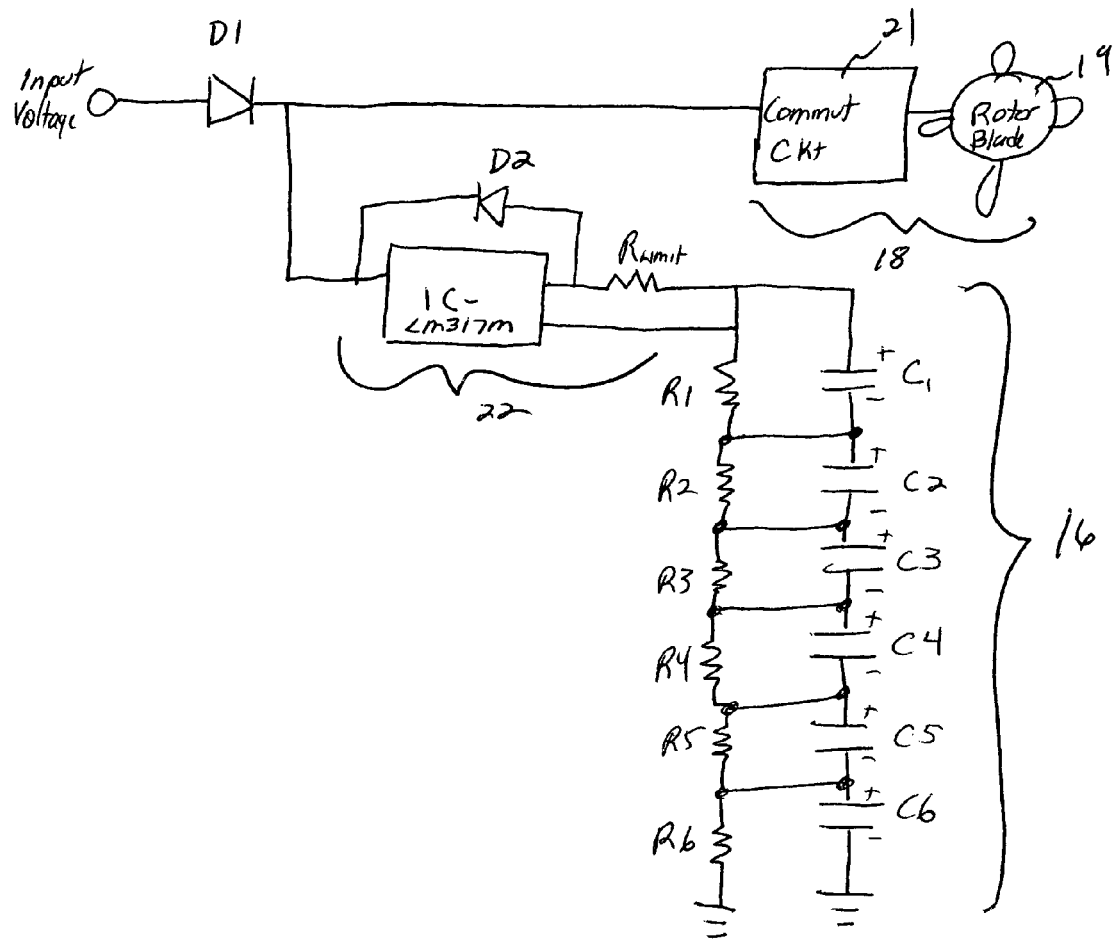
FIG. 4 schematically shows another circuit that may be used to implement illustrative embodiments of the invention.
Figure 1:
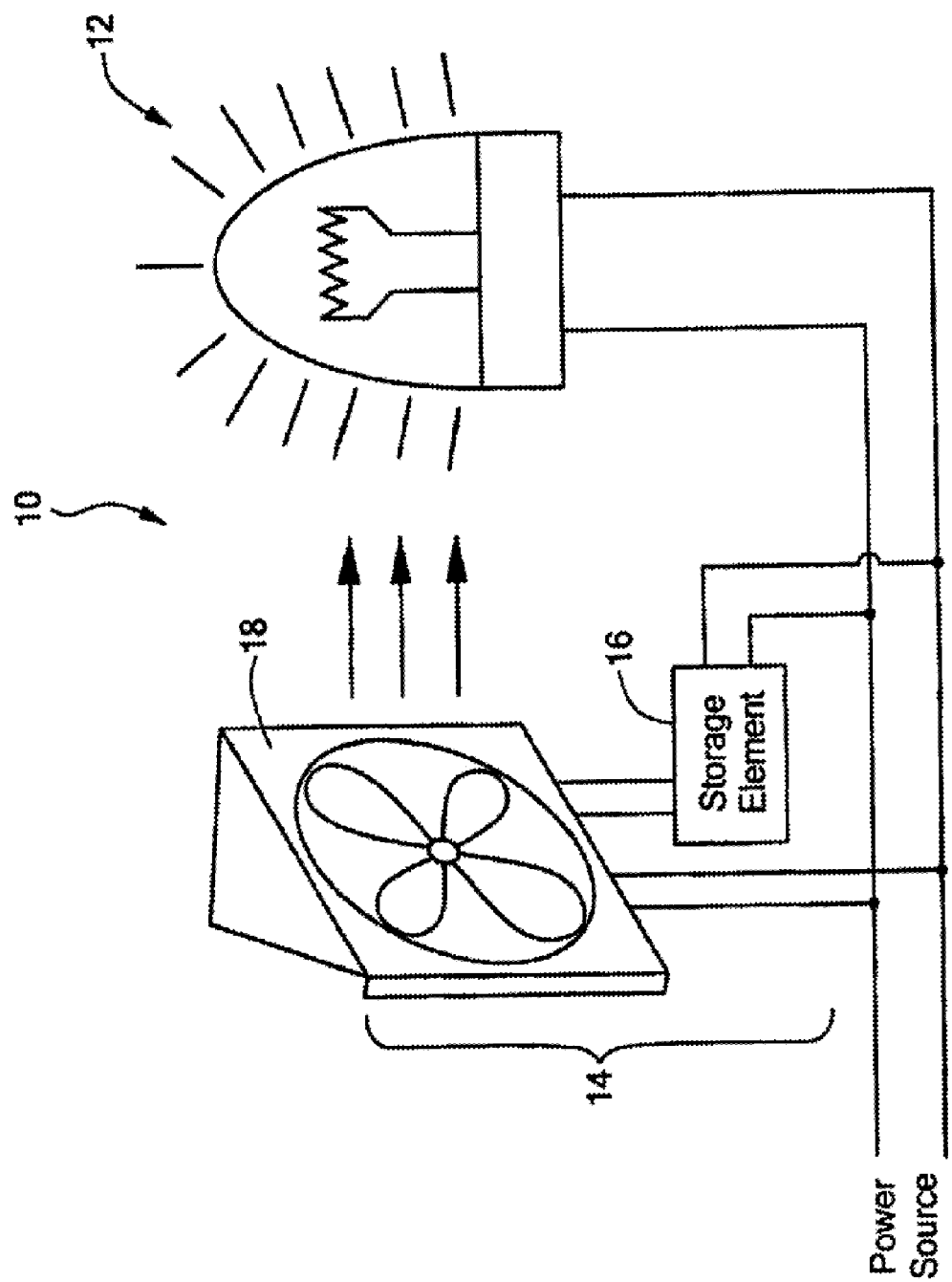
Figure 2:
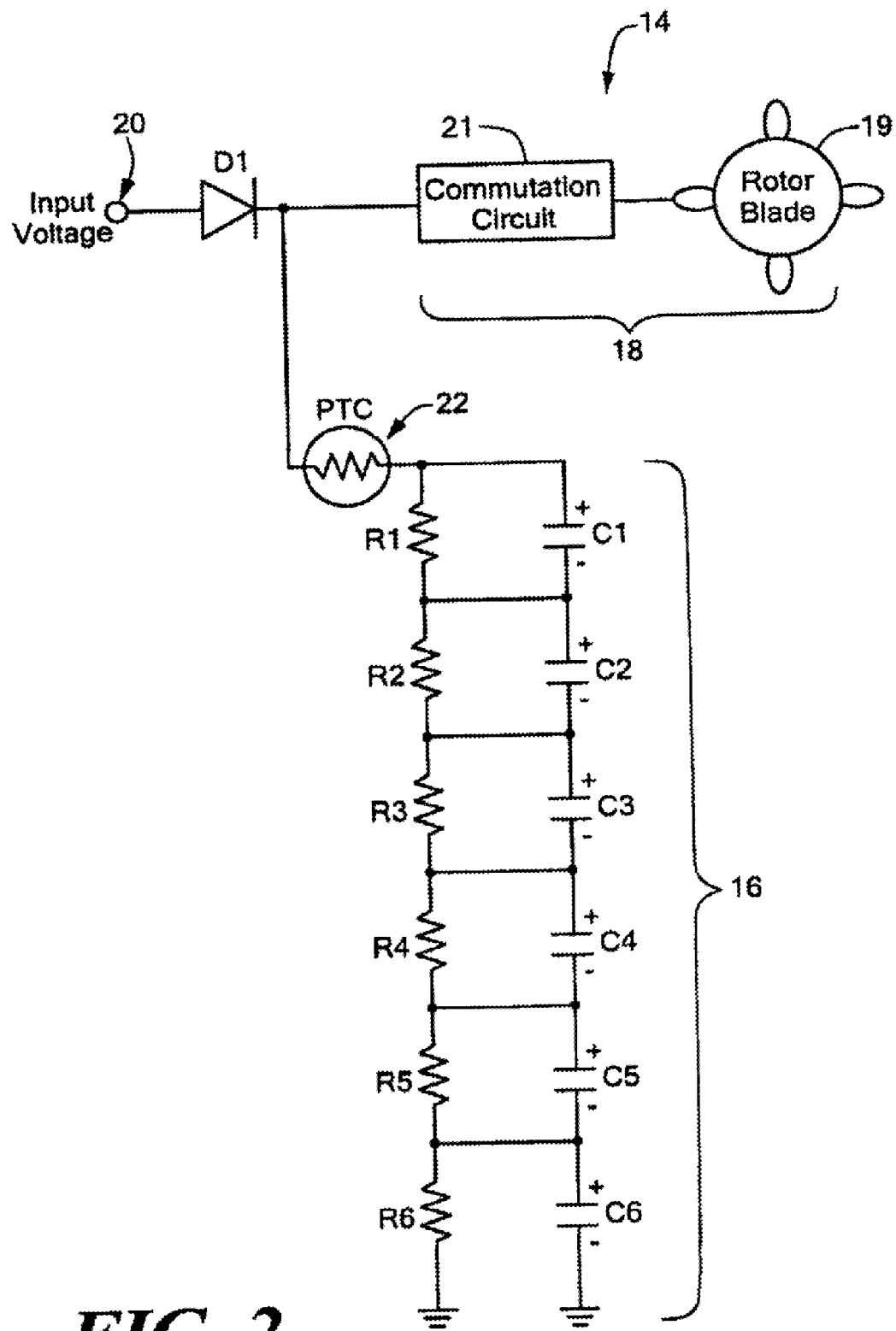
Figure 3:
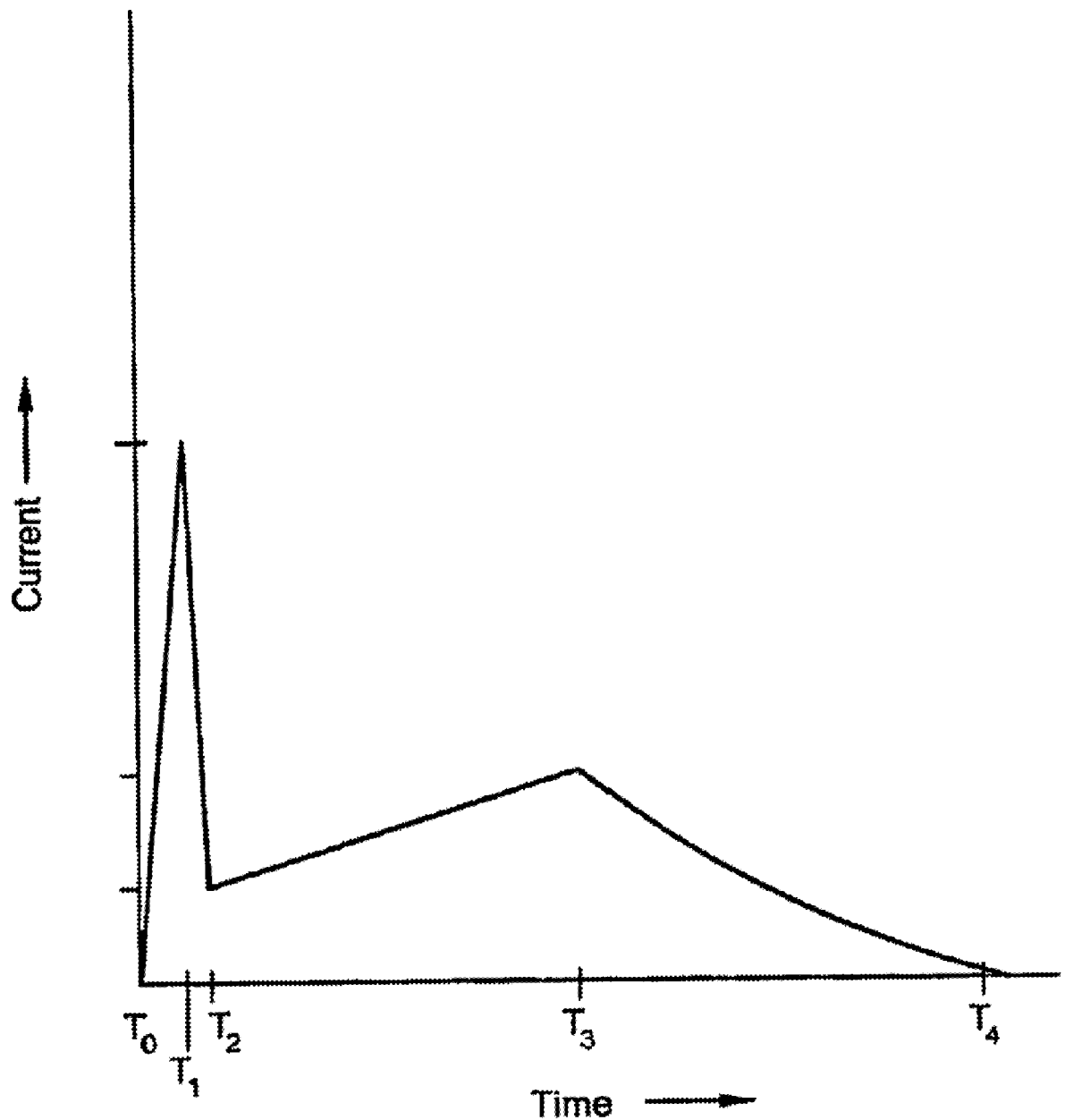
Figure 4:
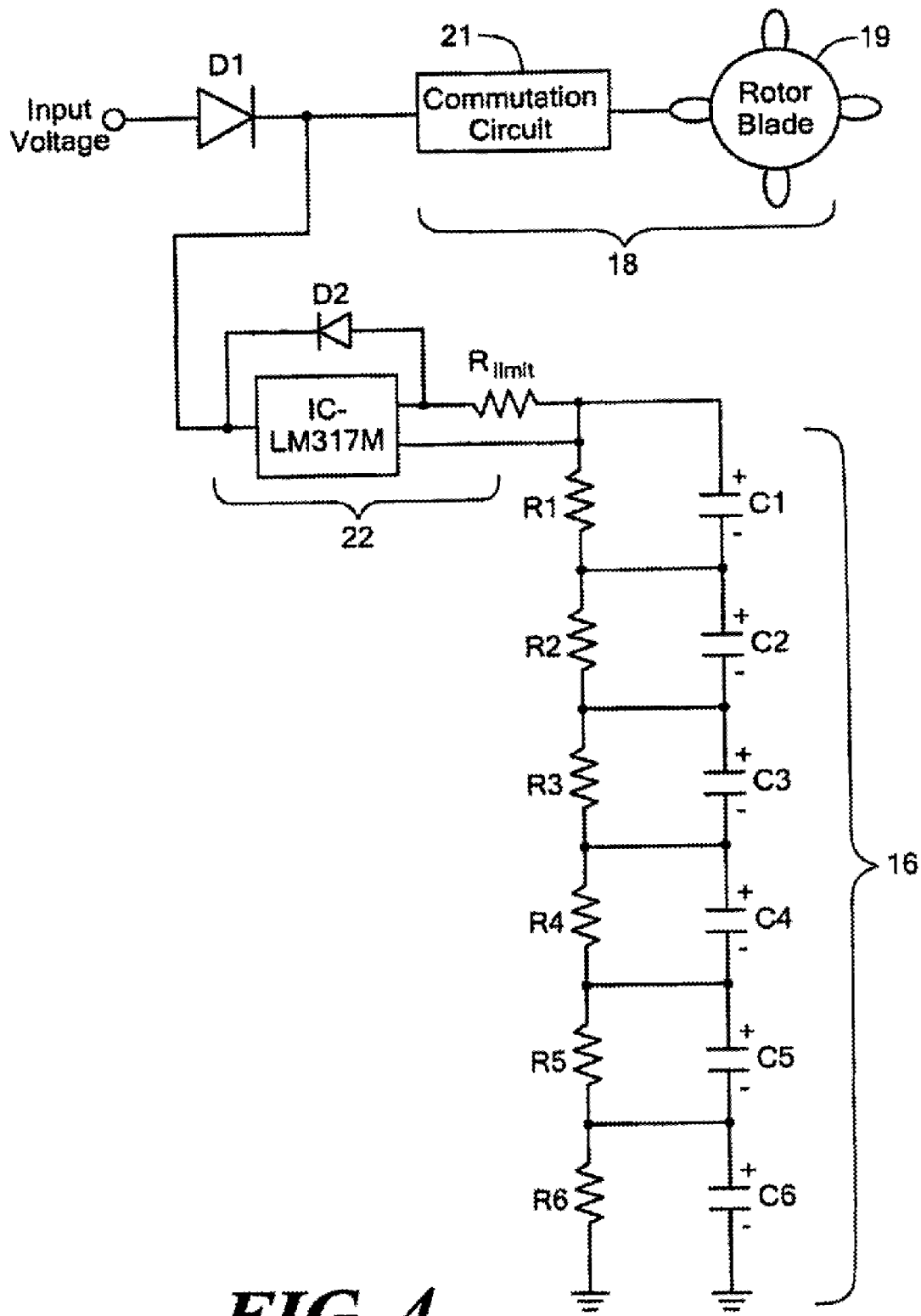

FIG. 4 schematically shows another embodiment of the cooling element 14 with an alternative current limiting circuit 22. In this embodiment, the current limiting circuit 22 is a constant current device configured to provide a constant current draw to the capacitors C1-C6. By way of example, the current limiting module in this embodiment may be an integrated circuit, such as a model number LM317M adjustable linear voltage/current regulator, distributed by National Semiconductor Corporation of Santa Clara, Calif. If using the LM317M, the current limiting module includes a return diode D2 for permitting current to flow from the capacitors to the fan 18, and a current limit resistor R-lim that sets the constant current value of the LM317M. Accordingly, the constant current value may be externally modified simply by changing the current limit resistor R-lim.

It should be noted that in other embodiments, other types of current limiting circuits may be used. Accordingly, for such embodiments, the PTC 22 and adjustable linear voltage/current regulator circuit are exemplary and not intended to limit all embodiments of the invention.

Although various exemplary embodiments of the invention are disclosed below, it should be apparent to those skilled in the art that various changes and modifications can be made that will achieve some of the advantages of the invention without departing from the true scope of the invention.

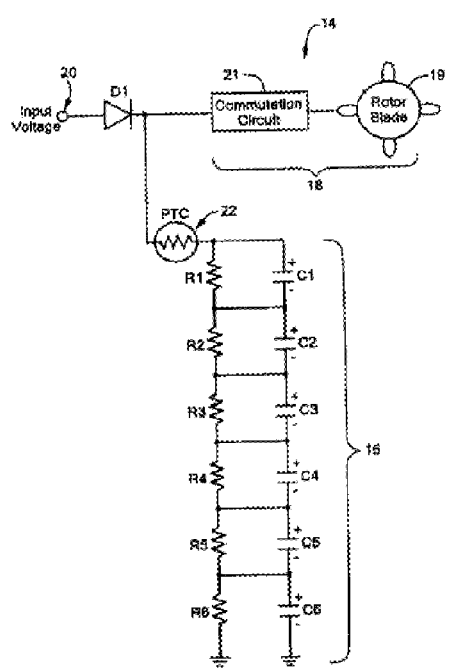

What is claimed is:

1. A backup power supply for supplying electric power to fan rotor circuitry that controls rotation of a fan rotor, the backup power supply comprising:
    an input for receiving an input voltage, the input being coupled to the rotor circuitry, the rotor circuitry being energizable by the input voltage; and
    a charge-current limited energy storage circuit coupled to the input and comprising a current limiting element coupled in series with capacitive storage, the current limiting element at least in part controlling an amount of current flow from the input to the capacitive storage, the series combination of the current limiting element and the capacitive storage being coupled in parallel with the rotor circuitry.

2. The backup power supply as defined by claim 1 wherein the current limiting element is configured to control current flow from the input to the capacitive storage at least in part as a function of the amount of current required to be drawn by the rotor circuitry.

3. The backup power supply as defined by claim 1 wherein the current limiting element is a PTC.

4. The backup power supply as defined by claim 1 wherein the current limiting element is an adjustable linear voltage/current regulator.

5. The backup power supply as defined by claim 1 wherein the capacitive storage includes a plurality of series capacitors.

6. The backup power supply as defined by claim 1 wherein the current limiting element is configured to ensure that the rotor circuitry has sufficient current to rotate the rotor when the storage element is charging.

7. A backup power supply for supplying electric power to fan rotor circuitry that controls rotation of a fan rotor, the backup power supply comprising:
    means for receiving an input voltage, the input means being coupled to the rotor circuitry, the rotor circuitry being energizable by the input voltage; and
    energy storage means coupled to the input means and comprising means for storing charge as a result of receiving current from the input means, coupled in series with means for at least in part controlling an amount of current flow from the input means to the storing means, the energy storage means being coupled in parallel with the rotor circuitry.

8. The backup power supply as defined by claim 7 wherein the controlling means includes means for controlling current flow from the input means to the storing means at least in part as a function of the amount of current required to be drawn by the rotor circuitry.

9. The backup power supply as defined by claim 7 wherein the controlling means is a PTC.

10. The backup power supply as defined by claim 7 wherein the controlling means comprises an adjustable linear voltage/current regulator.

11. The backup power supply as defined by claim 7 wherein the storing means includes a plurality of series capacitors.

12. The backup power supply as defined by claim 7 wherein the controlling means includes means for ensuring that the rotor circuitry has sufficient current to rotate the rotor when the storing means is charging.

13. A circuit for controlling rotation of a rotor, the rotor having associated rotor control circuitry for rotating the rotor, the circuit comprising:

an input, the rotor control circuitry capable of rotating the rotor in response to receipt of current drawn from the input;

a charge-current limited energy storage circuit coupled to the input and comprising a current limiting element coupled in series with a storage element capable of storing charge by drawing current from the input, the current limiting element being configured to control an amount of current drawn by the storage element at least in part as a function of the current required to be drawn by the rotor control circuitry, the series combination of the current limiting element and the storage element being coupled in parallel with the rotor circuitry.

14. The circuit as defined by claim 13 wherein the current limiting element is configured to ensure that the rotor circuitry receives enough current to rotate the rotor when the storage element is charging.

15. The circuit as defined by claim 13 wherein the current limiting element is configured to ensure that the motor begins operating substantially immediately after start-up.

16. The circuit as defined by claim 15 wherein the current limiting element is configured to ensure that the motor begins operating within one second after start-up.

17. The circuit as defined by claim 13 wherein the current limiting element is one of a PTC and a constant current device.

18. The circuit as defined by claim 13 wherein the storage element includes a plurality of series capacitors.

19. The circuit as defined by claim 13 wherein the storage element is in electrical communication with both the input and the rotor control circuitry.

20. The circuit as defined by claim 13 wherein the current limiting element is not coupled between the input and the rotor control circuitry.

21. The circuit as defined by claim 13 wherein the current limiting element isolates the rotor control circuitry from the storage element.

22. The backup power supply as defined by claim 1, wherein the current limiting element is not connected in series between the input and the rotor circuitry.

23. The backup power supply defined by claim 7, wherein the controlling means is not coupled in series between the input means and the rotor circuitry.

24. The circuit defined by claim 13, wherein the current limiting element is not connected in series between the input and the rotor control circuitry.

25. The backup power supply as defined by claim 1, wherein the capacitive storage comprises a capacitor having a value of at least one farad.

26. The backup power supply as defined by claim 7, wherein the storing means comprises a capacitor having a value of at least one farad.

27. The backup power supply as defined by claim 13, wherein the storage element comprises a capacitor having a value of at least one farad.

* * * * *

UNITED STATES PATENT AND TRADEMARK OFFICE
CERTIFICATE OF CORRECTION

PATENT NO.         : 7,314,350 B2
APPLICATION NO.  : 10/616499
DATED                 : January 1, 2008
INVENTOR(S)       : Brown It is certified that error appears in the above-identified patent and that said Letters Patent is hereby corrected as shown below:

Delete Title page illustrating a figure(s), and substitute therefor, new Title page illustrating a figure(s). (attached)

Delete drawing sheets 1-4, and substitute therefor drawing sheets 1-4. (attached)

Signed and Sealed this

Thirteenth Day of May, 2008

JON W. DUDAS
*Director of the United States Patent and Trademark Office*

(12) United States Patent
Brown

(10) Patent No.: US 7,314,350 B2
(45) Date of Patent: Jan. 1, 2008

(54) ENERGY STORE CIRCUIT FOR CONTROLLING ROTOR ROTATION

(75) Inventor: Fred A. Brown, Coronado, CA (US)

(73) Assignee: Comair Rotron, Inc., San Diego, CA (US)

( * ) Notice: Subject to any disclaimer, the term of this patent is extended or adjusted under 35 U.S.C. 154(b) by 562 days.

(21) Appl. No.: 10/616,499

(22) Filed: Jul. 9, 2003

(65) Prior Publication Data
US 2004/0036431 A1  Feb. 26, 2004

Related U.S. Application Data

(60) Provisional application No. 60/417,827, filed on Oct. 11, 2002, provisional application No. 60/397,694, filed on Jul. 22, 2002.

(51) Int. Cl.
*F04B 49/06* (2006.01)

(52) U.S. Cl. .................. 417/44.1; 417/44.11; 417/411

(58) Field of Classification Search .............. 417/44.1, 417/44.11, 411; 310/72, 68 R; 318/794, 318/795, 796
See application file for complete search history.

(56) References Cited

U.S. PATENT DOCUMENTS

| | | | |
|---|---|---|---|
| 3,841,746 A | 10/1974 | Chase et al. | 353/15 |
| 4,494,055 A | 1/1985 | Bitting et al. | 318/254 |
| 4,499,408 A | 2/1985 | Bitting et al. | 318/254 |
| 4,500,821 A | 2/1985 | Bitting et al. | 318/254 |
| 4,535,275 A | 8/1985 | Müller | 318/254 |
| 4,618,803 A * | 10/1986 | Hardy | 315/241 R |
| 4,751,398 A | 6/1988 | Ertz, III | 307/66 |
| 5,619,076 A | 4/1997 | Layden et al. | 307/48 |
| 6,388,392 B1 * | 5/2002 | Flory, IV | 315/291 |
| 6,709,111 B2 * | 3/2004 | Hirao et al. | 353/52 |
| 7,137,015 B2 | 11/2006 | Su | 713/300 |

FOREIGN PATENT DOCUMENTS

| | | |
|---|---|---|
| JP | 01123419 | 5/1989 |
| JP | 403052575 A | 3/1991 |
| JP | 406098479 A | 4/1994 |
| JP | 10197952 | 7/1998 |
| JP | H11-231419 | 8/1999 |
| JP | 2000021457 A | 1/2000 |

* cited by examiner

*Primary Examiner*—Anthony Stashick
*Assistant Examiner*—Vikansha Dwivedi
(74) *Attorney, Agent, or Firm*—Bromberg & Sunstein LLP

(57) ABSTRACT

A fan controller for controlling the rotation of a rotor (with a fan blade) has a current limiting element to control current flow to a capacitive storage apparatus. More specifically, the fan controller has an input for receiving an input voltage, the noted capacitive storage in electrical communication with both rotor circuitry (that controls rotor rotation) and the input, and the noted current limiting element coupled between the input and the capacitive storage. The rotor circuitry is energizable by the input voltage, while, in a similar manner, the capacitive storage is capable of charging by receiving current from the input. The current limiting element at least in part controls current flow from the input to the capacitive storage.

27 Claims, 4 Drawing Sheets